Figure 1:
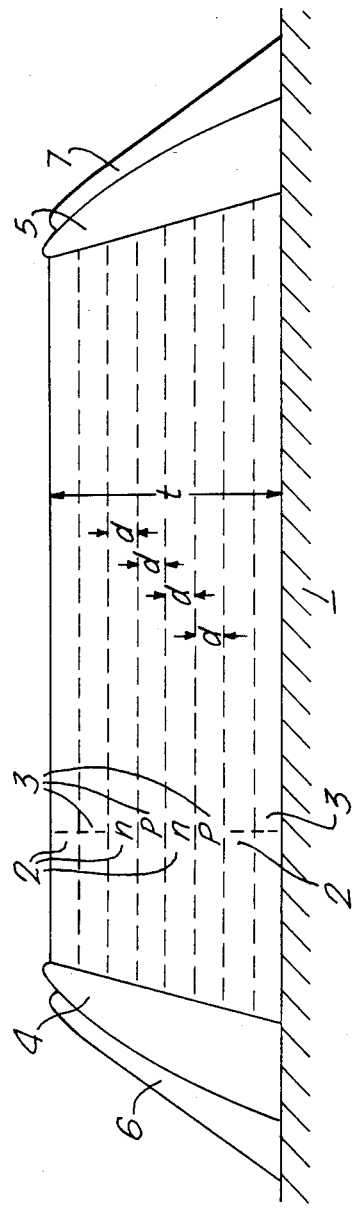

United States Patent [19]

Knowles et al.

[11] Patent Number: 4,786,335
[45] Date of Patent: Nov. 22, 1988

[54] INFRA-RED DETECTOR

[75] Inventors: Peter Knowles, Watford; Graham T. Jenkin, Pinner, both of England

[73] Assignee: The Marconi Company Limited, England

[21] Appl. No.: 700,923

[22] Filed: Oct. 19, 1984

[51] Int. Cl.[4] .................... H01L 35/00; H01L 27/14
[52] U.S. Cl. .................................... 136/214; 357/30; 136/225; 136/238
[58] Field of Search .............. 136/213, 214, 215, 206, 136/238, 225, 243, 246, 264; 374/178; 357/11, 19, 30, 36, 63

Primary Examiner—Charles T. Jordan
Assistant Examiner—T. J. Wallen
Attorney, Agent, or Firm—Kirschstein, Kirschstein, Ottinger & Israel

[57] ABSTRACT

A novel multilayer photoconductive I.R. detector is formed by incorporating alternate p and n-type layers, such that many layers occupy the detector thickness. The detector may be considered as a n-type photoconductor containing buried isolated p-type regions which give rise to internal electric fields the effect of which is to enhance minority carrier lifetime and inhibit motion of minority carriers towards surfaces.

11 Claims, 2 Drawing Sheets

INFRA-RED DETECTOR

The present invention relates to infra-red photodetectors of the type incorporating cadmium mercury telluride ($Cd_xHg_{1-x}Te$) as the photosensitive material and relates particularly to photoconductive detectors of this type.

The minority carrier lifetime is an important material parameter in cadmium mercury telluride photoconductive detectors, particularly in applications where high responsivity or long minority carrier drift length is required. The effective minority carrier lifetime is limited by bulk recombination processes and by the surface recombination velocity. The surface recombination velocity is highly sensitive to the processing techniques used in the manufacture of the photodetector.

An object of the present invention is to provide a high performance cadmium mercury telluride infra-red photodetector by means of a structure which enhances the mean lifetime of the minority carriers.

According to the present invention, a photodetector comprises:

(a) a multiplicity of superimposed thin epitaxial layers of semiconducting material deposited on a substrate, said layers being at least partially transmissive to exciting radiation, (b) a pair of metallic contacts located adjacent opposite edges of said multiplicity of superimposed layers, and (c) means for directing said exciting radiation onto said multiplicity of superimposed thin epitaxial layers to generate photoexcited carriers within said layers wherein semiconducting material for isolating one set of alternate ones of said layers from the corresponding other set of alternate ones of said layers is interposed between at least alternate ones of said superimposed thin epitaxial layers and said metallic contacts, said layers are composed of cadmium mercury telluride and said sets of alternate layers from traps between their interfaces for said photoexcited carriers.

Preferably the photodetector incorporates a multiplicity of said layers—typically 10 or more. Preferably said layers are less than 1 m thick.

The two sets of layers may be doped differently so that one set of layers has p-type conductivity and the other set of layers has n-type conductivity. Alternatively both sets of layers may be p-type (or both n-type) but differ in their degree of doping.

The layers may be grown by molecular beam epitaxy, metal organic vapour phase epitaxy, or by other suitable known epitaxial growth methods on a suitable substrate.

During deposition of the layers, the type of doping (p-type or n-type) and/or the degree of doping may be varied continuously or discontinuously, depending on the conduction and valence band profiles required. The composition of the cadmium mercury telluride may be varied during deposition by periodically varying the cadmium: mercury ratio, thereby defining a stack of layers in which the value of x in the formula $Cd_xHg_{1-x}Te$ varies periodically.

Figure 2:
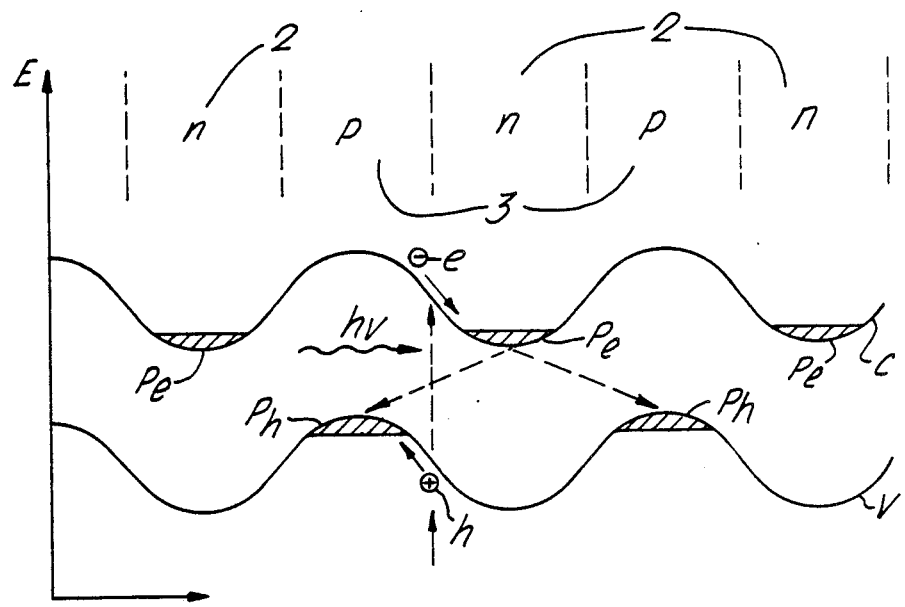
Figure 3:
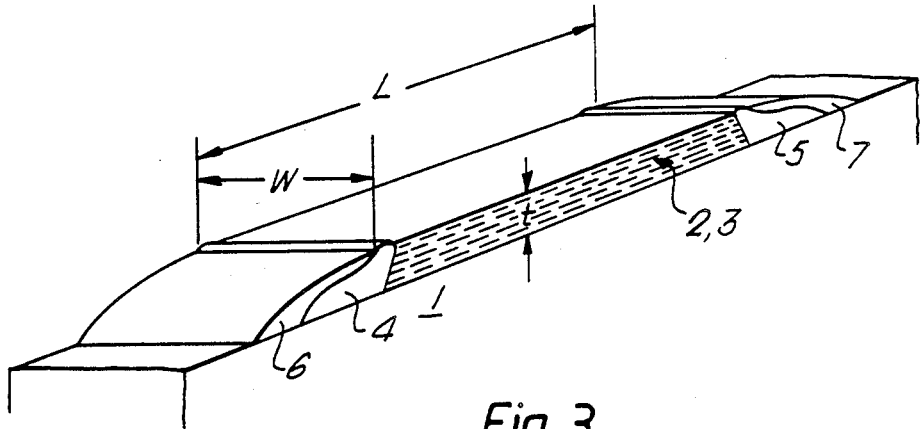

One embodiment of the invention will now be described, by way of example only, with reference to FIGS. 1 to 3 of the accompanying drawings, of which:

FIG. 1 is a diagrammatic cross-section of a photoconductive I.R. photodetector in accordance with the invention, FIG. 2 is an energy level diagram relating to the epitaxial layers of FIG. 1, and FIG. 3 is a sketch perspective view of the detector of FIG. 1.

FIG. 1 shows a stack of epitaxially deposited cadmium mercury telluride layers on a substrate 1. One set of alternate layers 2 is doped n-type and the other set 3 is doped p-type. The p-type layers are isolated from the n-type layers by n-type regions 4 and 5. Deposited metal contacts 6 and 7 are arranged to generate a field gradient in the plane of the layers 2, 3.

The band extrema as a function of distance along the growth axis are shown in FIG. 2. It will be seen that the energy levels E of the conduction band C and the valence band V vary periodically through the thickness of the detector.

The principle of operation is also indicated in FIG. 2. Absorption of radiation h by direct interband transitions is followed by relaxation of photoexcited carriers to adjacent band extrema (electrons e in conduction band, holes h in valence band). The periodic doping of the structure causes the photoexcited electron and hole carriers to occupy spatially discrete planes $P_e$ and $P_h$ and recombination rates (shown by dashed arrows) may be lowered compared with uniformly doped material, with consequent enhancement of the effective minority carrier lifetime.

The mobility of electrons and holes in the direction perpendicular to the doping planes is lowered compared with uniformly doped material, and drift or diffusion of photoexcited carriers to the detector surface lying parallel to the doping planes is inhibited by the periodic internal electric fields in the detector. Low surface recombination rates are achieved by this method.

Electron and hole mobility in the two dimensions parallel to the doping planes is not inhibited by periodic electric fields and long minority carrier drift lengths result in these directions.

The detector geometry shown as an example in FIG. 3 makes optimum use of this periodically doped structure when L, W >> t and L can be long compared with conventional detectors and can take advantage of the highly uniform large area samples characteristic of epitaxial growth. As an example, this structure could be very advantageous in the type of detector known as a 'TED' or 'SPRITE' (Dr. C. T. Elliott, "The Sprite Detector", I.E.E. Conference on Advanced Infrared Detectors and Systems, October, 1981). This disclosure (which is hereby incorporated by reference) describes an I.R. photodetector in which detected radiation is scanned over the photosensitive material of the photodetector in the same direction as and at the same speed as the drift of photoexcited holes. In accordance with the invention, the photosensitive material may be in the form of epitaxial layers 23 as shown in the drawings. Thus in FIG. 3 incident radiation 9 is focussed into a beam 10 which is scanned in direction D along the exposed surface of epitaxial layers 23 by scanning means 8 (indicated schematically). The scanning velocity is the same as the hole drift velocity—thus photo-generated holes drift in direction D and follow the scanned beam 10.

In general specialised contacts will be required to operate the device illustrated in FIG. 3. The p-type layers should be isolated from the metal contact in order to preserve the enhancement of minority carrier lifetime in n-type material, made possible by the use of the multilayer structure. The CMT surface immediately below the metal contact should be n-type, which can be achieved for example by ion implanation.

The device is essentially an n-type photoconductor with buried isolated p-type layers.

We claim:

1. A photodetector comprising:
   (a) a multiplicity of superimposed thin epitaxial layers of semiconducting material deposited on a substrate, said layers being at least partially transmissive to exciting radiation,
   (b) a pair of metallic contacts located adjacent opposite edges of said multiplicity of superimposed layers, and
   (c) means for directing said exciting radiation onto said multiplicity of superimposed thin epitaxial layers to generate photoexcited carriers within said layers, wherein semiconducting material for isolating one set of alternate ones of said layers from the corresponding other set of alternate ones of said layers is interposed between at least alternate ones of said superimposed layers and said metallic contacts, said layers are composed of cadmium mercury telluride and said sets of alternate layers from traps between their interfaces for said photoexcited carriers.

2. A photodetector as claimed in claim 1 incorporating ten or more of said layers.

3. A photodetector as claimed in claim 1 wherein said layers are up to 1 $\mu$m thick.

4. A photodetector as claimed in claim 2 wherein said layers are up to 1 $\mu$m thick.

5. An infra-red photodetector as claimed in claim 1.

6. A photodetector as claimed in claim 1 wherein one of said sets of layers is of n-type conductivity and the other of said sets of layers is of p-type conductivity.

7. A photodetector as claimed in claim 1 wherein said sets of layers are both of n-type conductivity but differ in their degree of n-character.

8. A photodetector as claimed in claim 1 wherein said sets of layers are both of p-type conductivity but differ in their degree of p-character.

9. A photodetector as claimed in claim 1 wherein at least one of said sets of alternate layers is doped with a dopant element.

10. A photodetector as claimed in claim 9 wherein said layers are defined by a periodic variation in the concentration of said dopant element through the thickness of the material epitaxially deposited on the substrate.

11. A photodetector as claimed in claim 1 further comprising scanning means for scanning detected radiation over said layers in the same direction as and at substantially the same speed as the drift of photoexcited holes between said contacts.

* * * * *